United States Patent [19]
Park et al.

[11] Patent Number: 5,610,874
[45] Date of Patent: Mar. 11, 1997

[54] FAST BURST-MODE SYNCHRONOUS RANDOM ACCESS MEMORY DEVICE

[75] Inventors: Hee-Chail Park; Kook-Hwan Kweon; Jeon-Taek Im, all of Kyungki-do, Rep. of Korea

[73] Assignee: Samsung Electronics Co., Ltd., Suwon, Rep. of Korea

[21] Appl. No.: 337,186

[22] Filed: Nov. 7, 1994

[30] Foreign Application Priority Data

Nov. 8, 1993 [KR] Rep. of Korea ............... 23603/1993

[51] Int. Cl.$^6$ ............... G11C 13/00; G11C 7/00
[52] U.S. Cl. ............... 365/236; 365/233; 365/230.01; 365/230.06
[58] Field of Search ............... 365/230.01, 233, 365/236, 230.06

[56] References Cited

U.S. PATENT DOCUMENTS

| | | | |
|---|---|---|---|
| 5,077,693 | 12/1991 | Hardee et al. | 365/230.08 |
| 5,268,865 | 12/1993 | Takasugi et al. | 365/189.05 |
| 5,390,149 | 2/1995 | Vogley et al. | 365/189.01 |
| 5,392,239 | 2/1995 | Margulis et al. | 365/233 |

*Primary Examiner*—Viet Q. Nguyen
*Attorney, Agent, or Firm*—William L. Geary, Jr.

[57] ABSTRACT

A synchronous random access memory device having an external address mode of operation and a burst mode of operation, in which a counter control circuit resets a burst mode counter during the external address mode of operation.

10 Claims, 9 Drawing Sheets

FAST BURST-MODE SYNCHRONOUS RANDOM ACCESS MEMORY DEVICE

BACKGROUND OF THE INVENTION

The present invention relates to a synchronous random access memory device, and more particularly to a synchronous random access memory device having an input/output scheme capable of operating in a burst mode.

Conventional random access memory devices perform read/write operations in response to an internal clock signal generated within the memory device. As is generally known, it is difficult to adapt conventional random access memory devices to operate at a speed compatible with overall system speed. This difficulty is primarily due to the complicated timing considerations of the memory device and limitations to the internal clock speed. Previous attempts to address this problem have resulted in various techniques for implementing a "synchronous" random access memory device. A synchronous random access memory device generally receives a system clock synchronous to the processing speed of the overall system and the circuitry internal to the memory device is operated in such a manner as to accomplish read/write operations in synchronism with the system clock.

In one conventional approach to the foregoing problem, the synchronous random access memory device operates in a burst mode wherein a counter automatically generates the next addresses upon receipt of an external address. The burst mode operation, thus, requires a burst counter and a burst address decoder on the same chip as the memory device. Burst mode operation is otherwise defined by the system user. Unfortunately, operating speeds for "burst mode" memory devices are not as high as desired because operating speed is degraded by transition of the output data through the burst counter and the burst address decoder.

Figure 1:
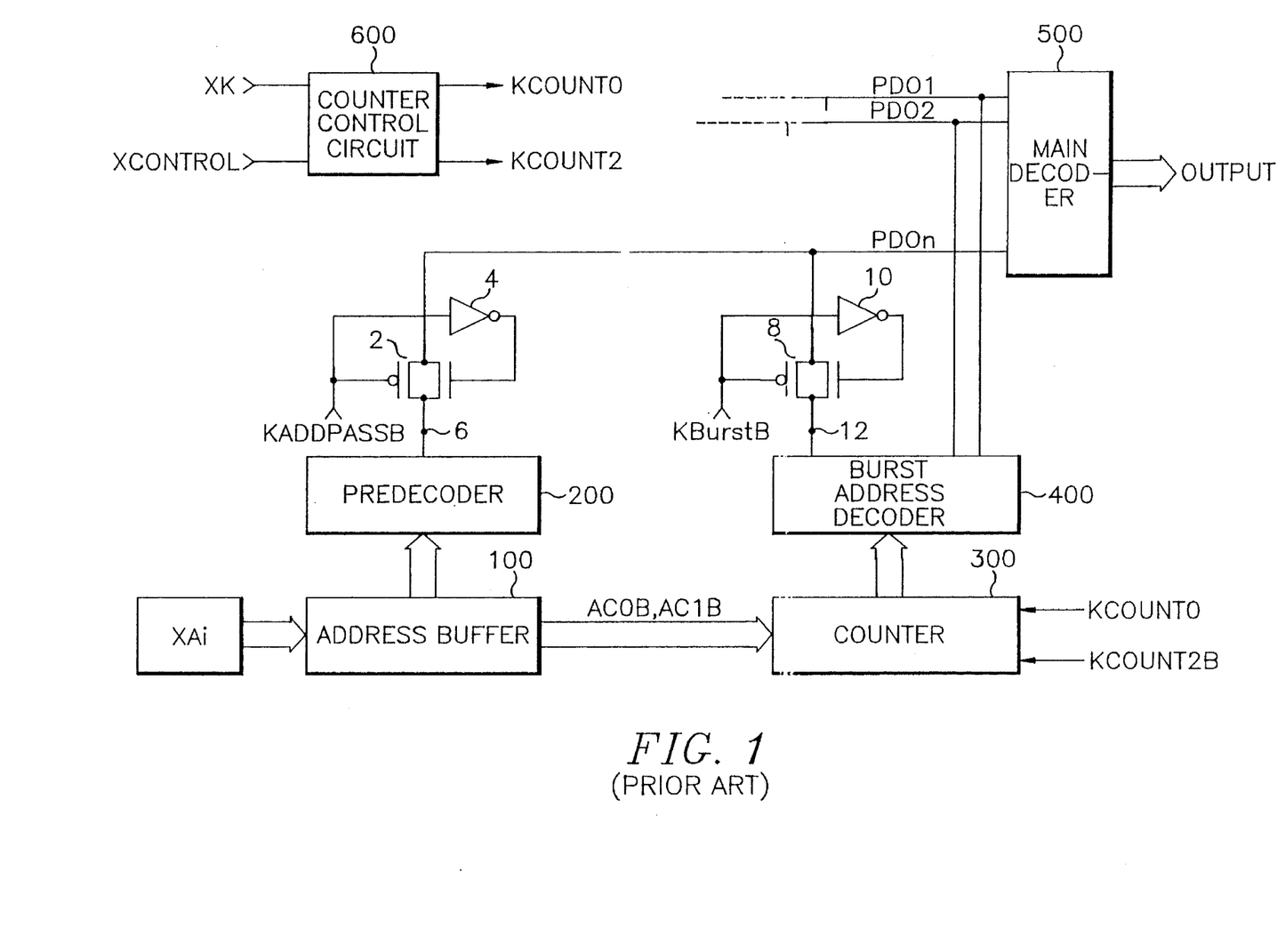
FIG. 1 is a block diagram showing a counter and other related circuits in a conventional synchronous RAM.

FIG. 1 is a block diagram showing a counter and other related circuits in a conventional synchronous random access memory device. Referring to FIG. 1, each signal can be referenced in the 1993 memory data book published by Samsung Electronics Co., Ltd., which is incorporated by reference herein. In FIG. 1, counter 300 serves as the conventional burst counter described above. In synchronism with the externally provided system clock signal XK, and when signal XK changes from logical "high" to "low", a counter control circuit 600 receives signal XCONTROL. While signal XCONTROL is low, an externally applied address signal is received. While XCONTROL is high, the address signal is automatically determined according to a counting method preceding burst mode operation. Counter 300 is connected to the lines PDO1, PDO2, ... PDn of main decoder 500 via a burst address decoder 400. This arrangement provides the "counting method" described above and thereby allows burst mode operation through the main decoder 500.

Figure 2A:
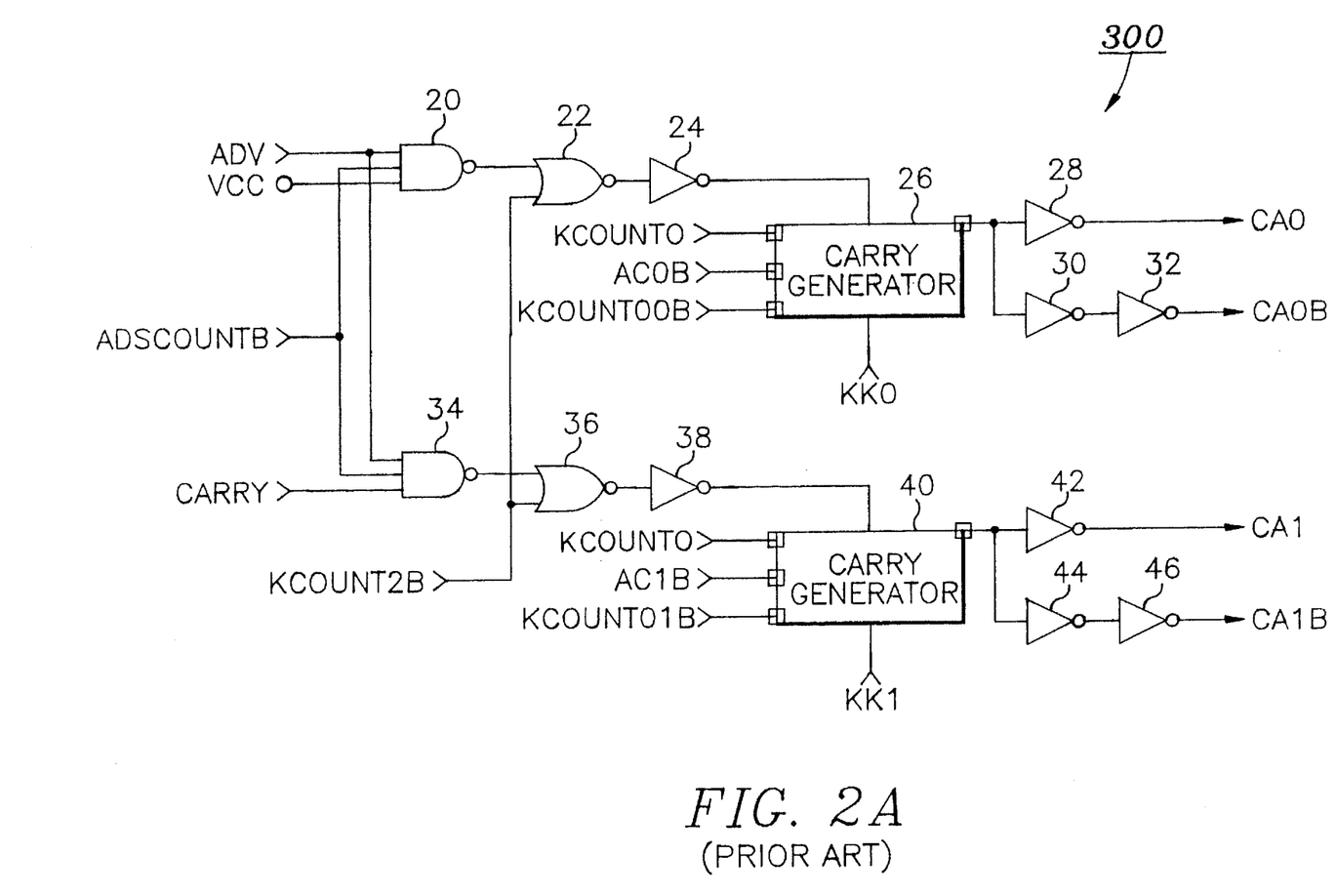
FIG. 2A is a more detailed circuit diagram of the counter shown in FIG. 1.
Figure 2B:
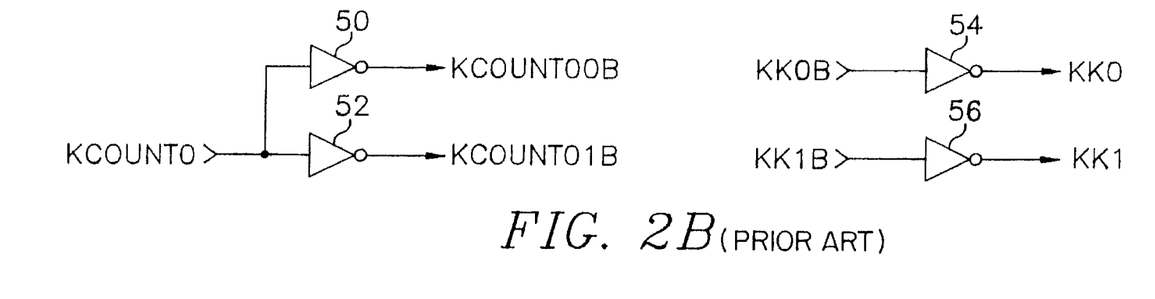
FIG. 2B is a circuit diagram illustrating the generation of various clock signals.
Figure 2C:
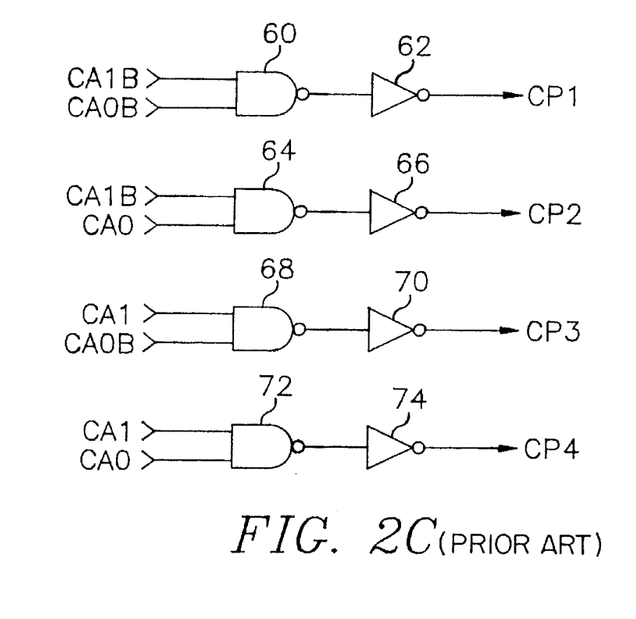
FIG. 2C is a more detailed diagram of the burst address decoder shown in FIG. 1.

FIG. 2A is a more detailed circuit diagram of counter 300 shown in FIG. 1. FIG. 2B is a circuit diagram illustrating the generation of the signals for input to carry generators 26 and 40 of FIG. 2A. FIG. 2C is a more detailed circuit diagram of the burst address decoder 400 shown in FIG. 1.

In FIG. 2A, signals ACOB and AC1B are outputs from address buffer 100 and are applied to carry generators 26 and 40 in counter 300. Signals KCOUNT00B and KCOUNT01B are logically formed by the circuit shown in FIG. 2B, and are input into carry generators 26 and 40 in counter 300 in FIG. 2A. In FIG. 2A, signals ADV and ADSCOUNTB are control signals which enable the burst mode. These signals are described in detail, relative to a product designated as part number MCM62486, on pages 7–91 through 7–99 of a 1991 data book entitled "32K×9 bit Burst RAM Synchronous Static RAM with Burst Counter and Self-Timed Write" and published by Motorola, which is incorporated by reference herein. Signals KK0 and KK1 are formed by the circuit shown in FIG. 2B, and applied to carry generators 26 and 40 in FIG. 2A.

FIG. 2A is constructed such that a single carry generator generates two counter output signals. The circuits related to an input/output stage of each carry generator 26 and 40 are similar to each other. The outputs of carry generators 26 and 40 are applied to the burst address decoders in FIG. 2C, and the output signals from that burst address decoder circuitry are applied to the main decoder 500 in FIG. 1.

Figure 3:
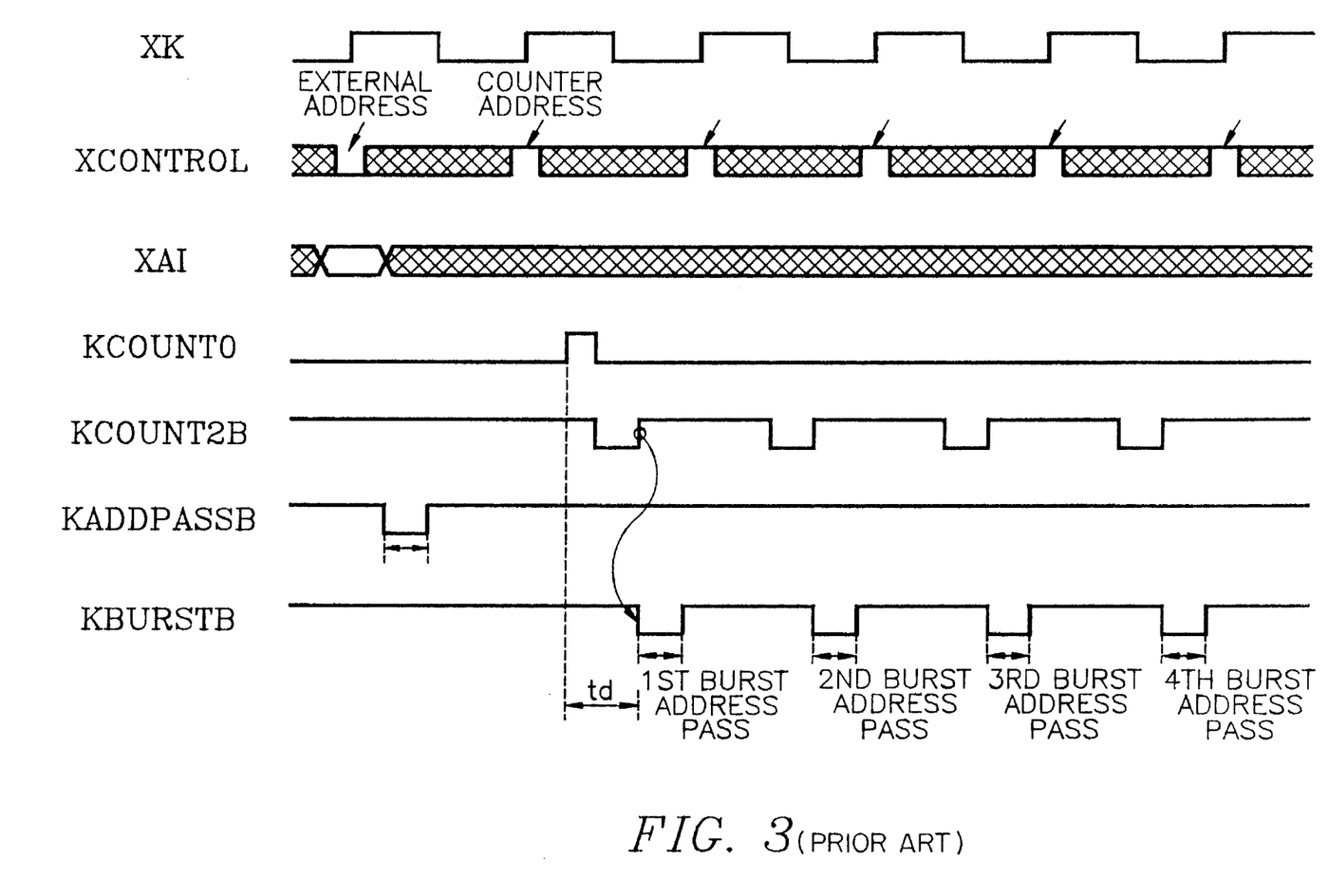
FIG. 3 is an operational timing diagram illustrating the relationship of primary signals for the circuit shown in FIG. 1.

FIG. 3 is an operational timing diagram illustrating the relationship of the primary control signals used in the conventional burst mode of FIGS. 1 and 2. When signal XCONTROL applied to counter control circuit 600 of FIG. 1 goes high, signals ADV and ADSCOUNTB in FIG. 2A also go high. When input signal KCOUNT2B from NOR gates 22 and 36 of FIG. 2A is received, signal XCONTROL increases the output of the counter by one. In operation, carry generators 26 and 40 are reset by a high pulse from signal KCOUNT0. So, whenever signal KCOUNT2B generates a low pulse, signal CA0 alternatingly has the value of 0 or 1 every one cycle to two cycles due to the carry.

As shown in FIG. 1, the output signal of burst address decoder 400 is applied to main decoder 500 via a transmission gate 8 which is controlled by a burst enable signal, KBurstB. Additionally, as shown in FIG. 3, counter 300 is reset when signal KCOUNT0 goes high, and counter 300 is enabled by signal KCOUNT2B, such that the burst enable signal, KBurstB, is low after signal KCOOUNT2B is high. Predetermined data is then applied to main decoder 500 via the transmitting gate 8. Thus, in conventional burst mode operation, as shown in FIG. 3, burst enable signal KBurstB becomes active after a time delay period, shown as "td", after signal KCOUNT0 has been enabled.

The operation of the foregoing circuitry inherently limits the operating speed of the memory device. Thus, it is difficult to perform high-speed operation of the conventional synchronous random access memory device in correspondence with the processing speed of the overall system. Furthermore, the trend towards faster system clocks and larger memory devices exacerbates the problem of conventional synchronous random access memory device operation.

SUMMARY OF THE INVENTION

It is therefore an object of the present invention to provide a synchronous random access memory device which performs a data access operation corresponding to the processing speed of a system.

It is another object of the present invention to provide a synchronous random access memory device which performs data access operations at high speed in a burst mode.

It is still another object of the present invention to provide a synchronous random access memory device in which an output signal of a counter is enabled at high speed and then applied to a main decoder in a burst mode.

It is a further object of the present invention to provide a synchronous random access memory device having a counter which performs high speed reset operations in a burst mode.

It is still a further object of the present invention to provide a synchronous random access memory device having a counter which is reset with a minimal delay time from the input of an external address to a synchronous random access memory device which can perform burst mode operation at high speed.

According to one aspect of the present invention, the synchronous random access memory device has a burst mode of operation comprising a counter control circuit for generating a counter enable signal which controls a counter in burst mode operation, and a counter responsive to the counter enable signal which is reset by an enabling control signal for the burst mode of operation.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENTS

In the following description, numerous specific details are set forth to provide a more thorough understanding of the present invention. It will be apparent, however, to one skilled in the art, that the present invention may be practiced with modifications, alterations and variations to these specific details.

FIGS. 1–3 already have been described with respect to the background of the invention.

Figure 4:
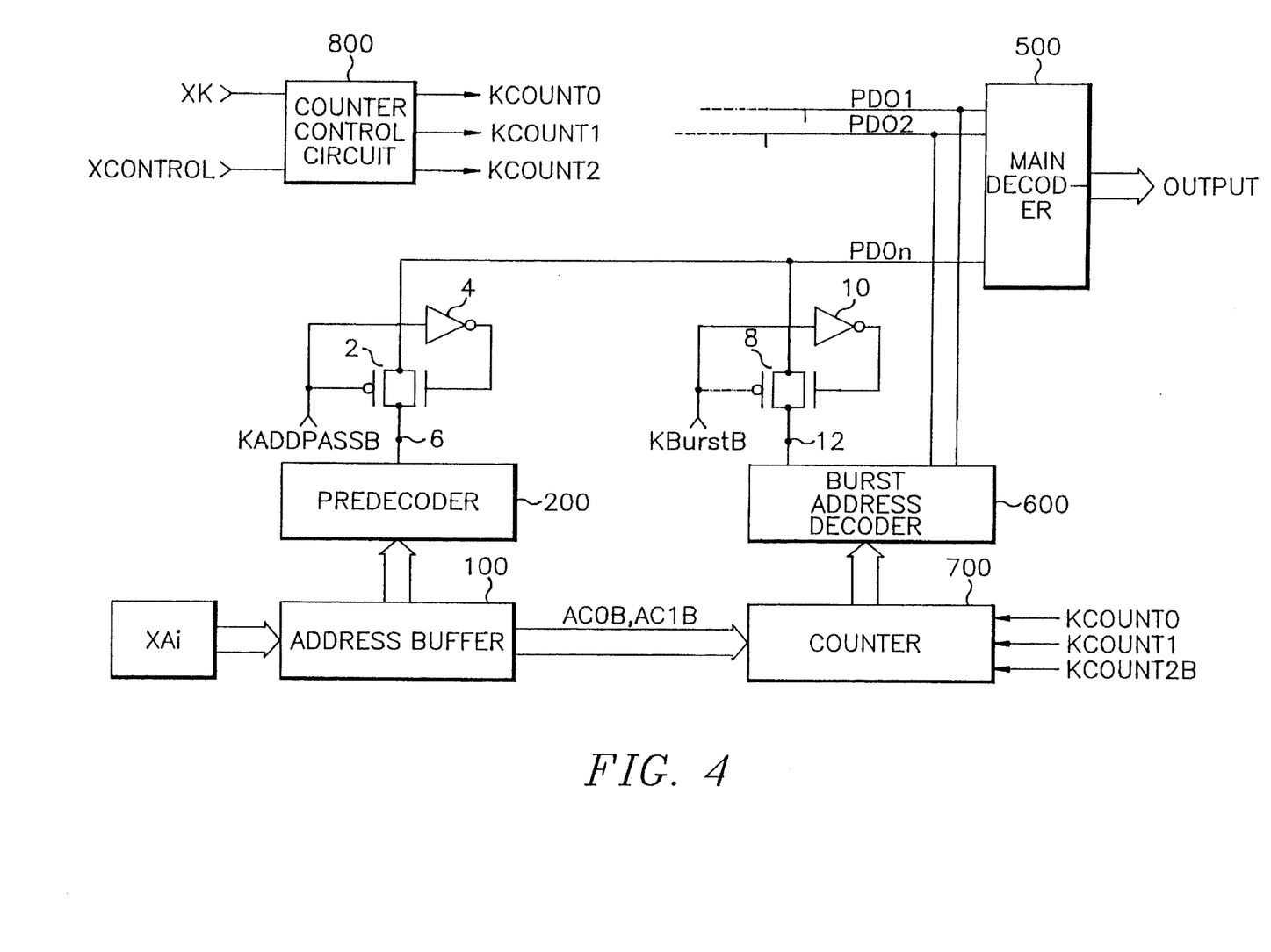
FIG. 4 is a block diagram showing a counter and related circuits according to one embodiment of the present invention.

FIG. 4 is a block diagram showing a counter and related circuits according to the present invention. In this circuit and unlike the conventional circuit, counter control circuit 800 receives system clock XK, and outputs counter enable signal KCOUNT0 to instantly reset the counter 700. Counter 700 receives the counter enable signal KCOUNT1, and performs a predetermined "set" operation using counter control signal KCOUNT1 in the burst mode. Signal KBurstB is used to control the transmission of the output signals from the burst address decoder 600 to the main decoder 500.

Figure 5:
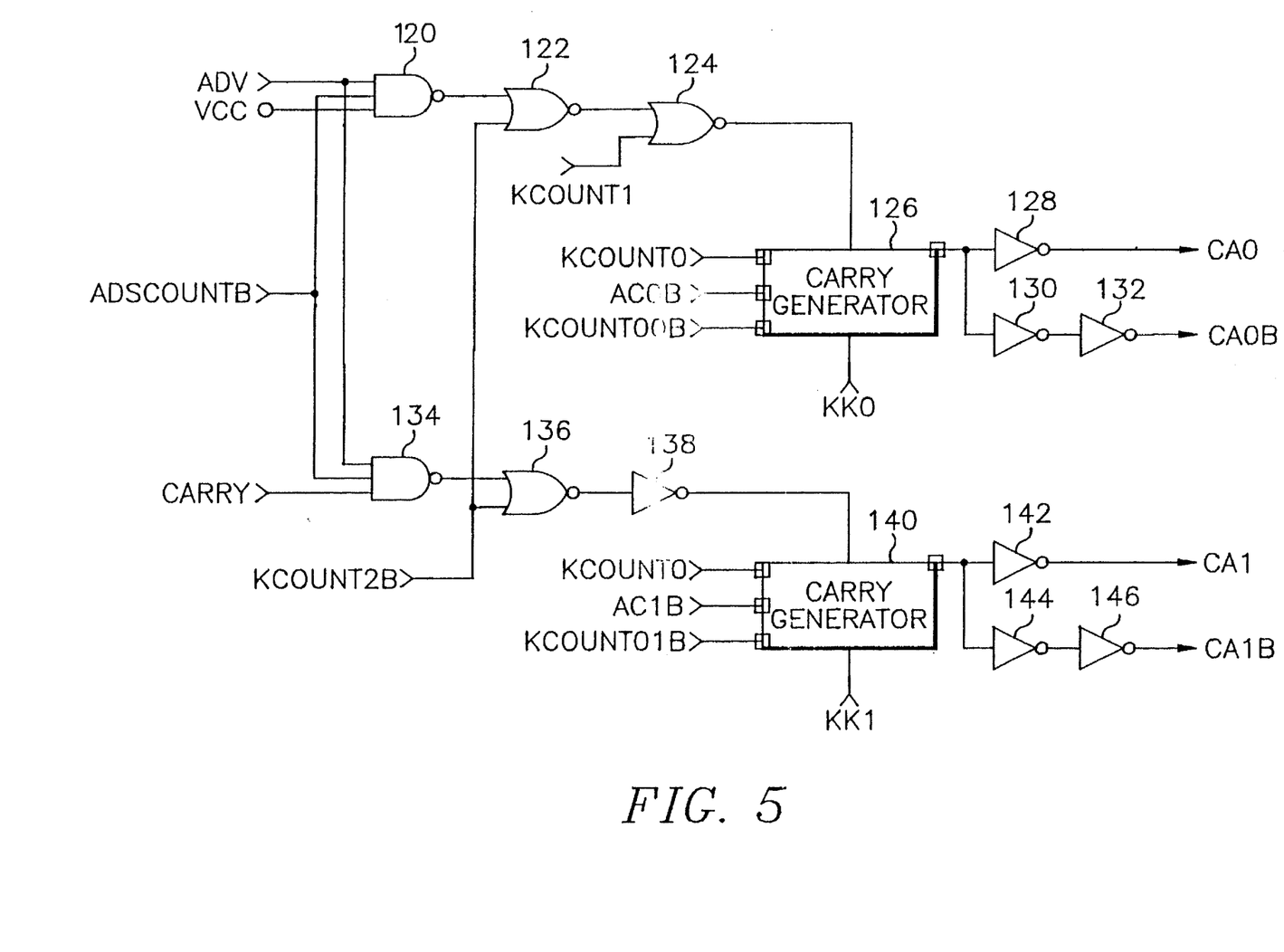
FIG. 5 is a more detailed circuit diagram of the counter shown in FIG. 4.

FIG. 5 is a circuit diagram showing the construction of the counter 700 of FIG. 4. Counter 700 includes a NAND gate 120 receiving signal ADV, a power voltage VCC, and a signal ADSCOUNTB. NOR gate 122 receives the output signal of the NAND gate 120 and a signal KCOUNT2B. NOR gate 124 receives the output signal of the NOR gate 122 and the signal KCOUNT1. A first carry generator 126 receives the output signal of NOR gate 124 and signals KCOUNT0, ACOB, KCOUNT00B and KK0; a NAND gate 134 receives signal ADV, power voltage VCC, and signal ADSCOUNTB; a NOR gate 136 receives the output signal of NAND gate 134 and signal KCOUNT2B; and inverter 138 receiving the output signal of NOR gate 136. Finally, second carry generator 140 receives the output signal of inverter 138 and signals KCOUNT0, AC1B, KCOUNT01B, and KK1. Here, the construction of burst address decoder 600 and circuit to generate signals KK0, KK1, KCOUNT00B, and KCOUNT01B are the same as those of FIGS. 2B and 2C.

Figure 6:
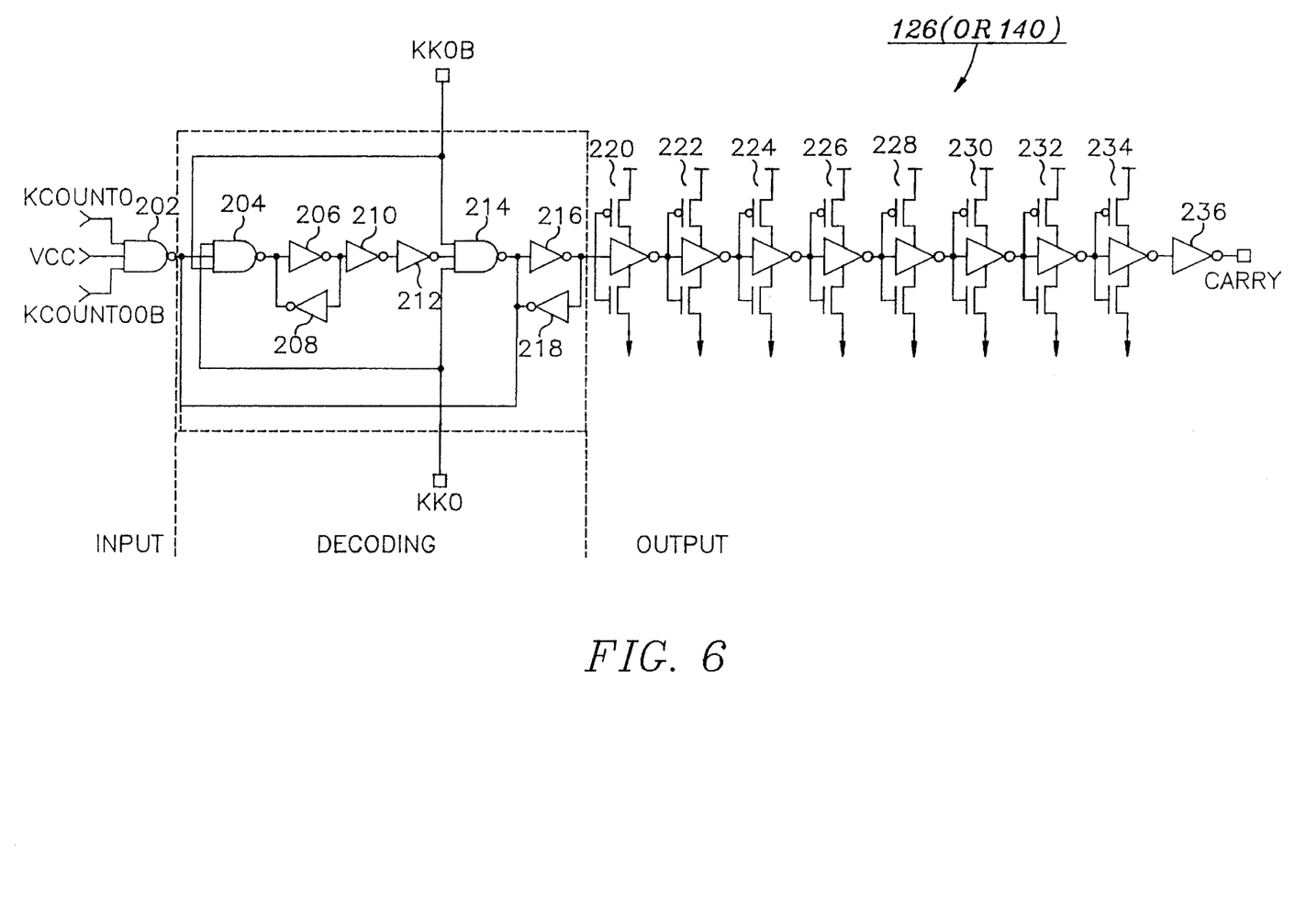
FIG. 6 is a more detailed circuit diagram of the carry generator shown in FIG. 5.

FIG. 6 shows the detailed circuit of carry generator 126 in FIG. 5. Further, the carry generator 140 of FIG. 5 has the construction shown in FIG. 6 except for the respective input signals. As shown in FIG. 6, carry generator 126 consists of an input portion, a decoding portion, and an output portion. The input portion of carry generator 126 consists of NAND gate 202 which receives signals KCOUNT0, KCOUNT00B, and VCC. The decoding portion of carry generator 126 includes NAND gate 204 and inverter 216 which receive the output of NAND gate 202. NAND gate 204 also receives signals KK0 and KK0B. The output portion of carry generator 126 comprises an inverter chain having a plurality of inverters 220, 222, ..., 236. The number of inverters in the inverter chain is chosen to correspond to the desired delay of the carry signal.

Operation of the counter and related control circuits according to the present invention is described below with reference to FIG. 7 which is an operational timing diagram for the control signals in FIGS. 4 to 6. As shown in FIG. 4, counter control circuit 800 generates the signal KCOUNT0 and KCOUNT1, thereby enabling the counter 700 to sense the states of addresses ACOB and AC1B output from address buffer 100. Thereafter, counter control circuit 800 operates counter 700 in advance to generate the carry signal as well as CA0 and CA1, thereby setting-up the input state of the next burst address.

Figure 7:
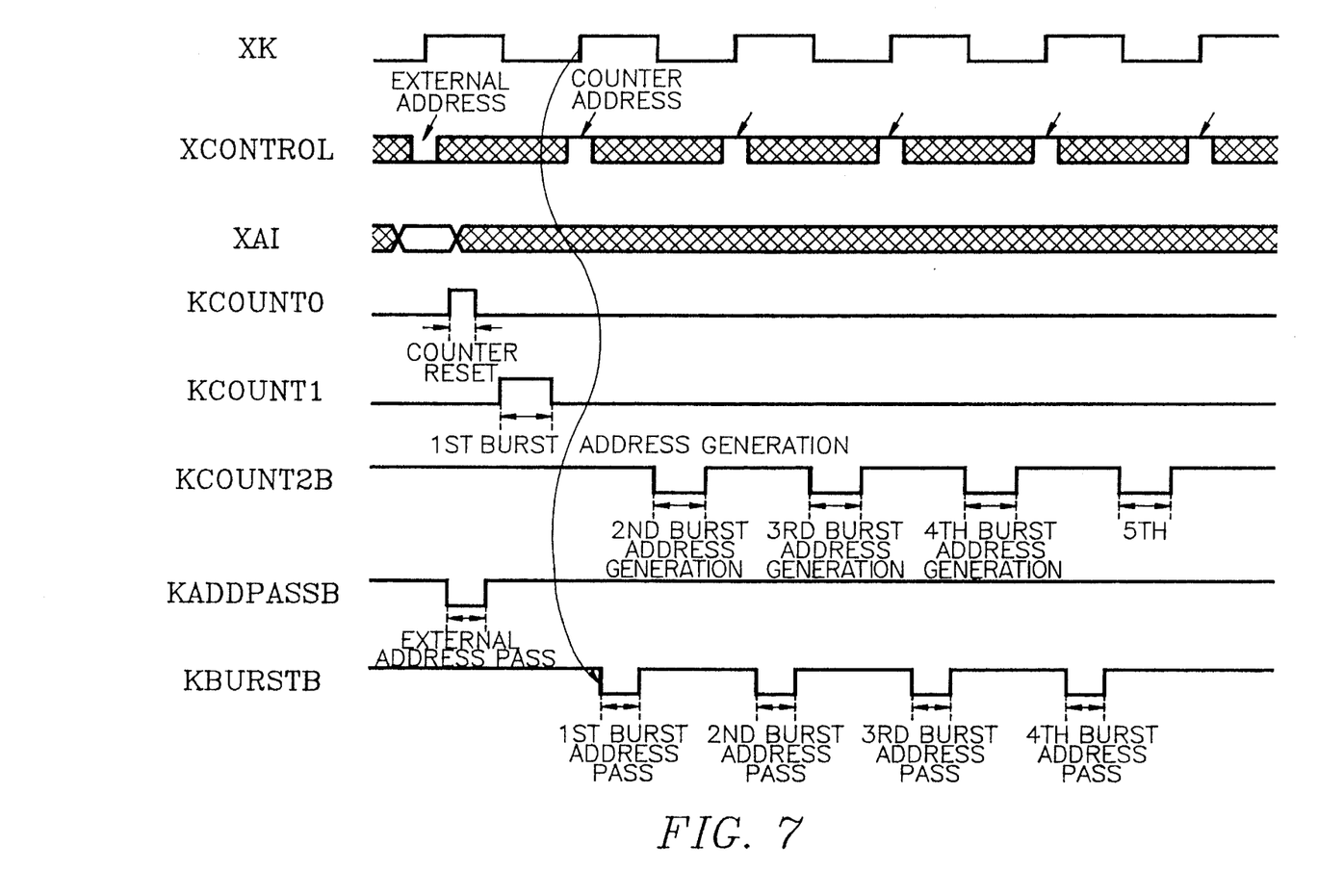
FIG. 7 is an operational timing diagram illustrating the burst mode operation of the circuit shown in FIG. 4.

In the timing diagram of FIG. 7, signal KCOUNT0 is synchronized with system clock XK and is placed in a high state. Signal KCOUNT0 is applied one of the inputs of the NAND gate 202 in FIG. 6. Thereby, the output of NAND gate 202 is low during the short period when both KCOUNT0 and KCOUNT00B are high (refer also to FIG. 2B). The low signal at the output of NAND gate 204 is delivered through inverter string 206, 210, and 212 to create a high signal at the input to NAND gate 214 and in synchronism with KK0B and KK0, the output of NAND gate 214 goes low to create a high signal at the output of the decoding portion, which is the output of inverter 216. The output signal is generated as the carry set at the high level through the output portion of inverter chain 215, ..., 236.

The signal KBurstB in FIG. 7 goes low regardless of signal KCOUNT2B, which is not the case with signal KBurstB in FIG. 3, and thus enabling the output of data from burst address decoder 600 in FIG. 4. Meanwhile, signal KADDPASSB of FIG. 7 is synchronized with the system clock XK and is changed to the low state, thereby enabling the output of the external address from the predecoder 200 to the main decoder 500. Here, it is possible that two cases will occur. In the first case, the next cycle had the same input of the external address as the previous cycle, the operation is performed using signal KADDPASSB in the manner as mentioned above. In the second case, a "pass pulse" is generated by the action of signal KBurstB going low. Therefore, the next burst address is defined by the counter 700. The burst address is gated from the burst address decoder 600 by a low signal KBurstB.

The above description is applied to the case of two burst addresses, but also may by applied to cases in which the number of burst addresses is increased by 4, 8, or 16 by appropriately adding the counter and the carry generator. The present invention can be incorporated into circuitry with multiple counters so that signals KCOUNT0 and KCOUNT1 reset and operate the counters when the external address is input to the counter. That is, as shown in FIG. 7, unlike the conventional device shown in FIG. 3, signal KBurstB may control the output of the data from burst address decoder 400 in synchronism with the system clock XK without having to wait for the enabling operation of signal KCOUNT2B. Thus, it is possible to perform data access operations at high speed in burst mode.

Figure 8:
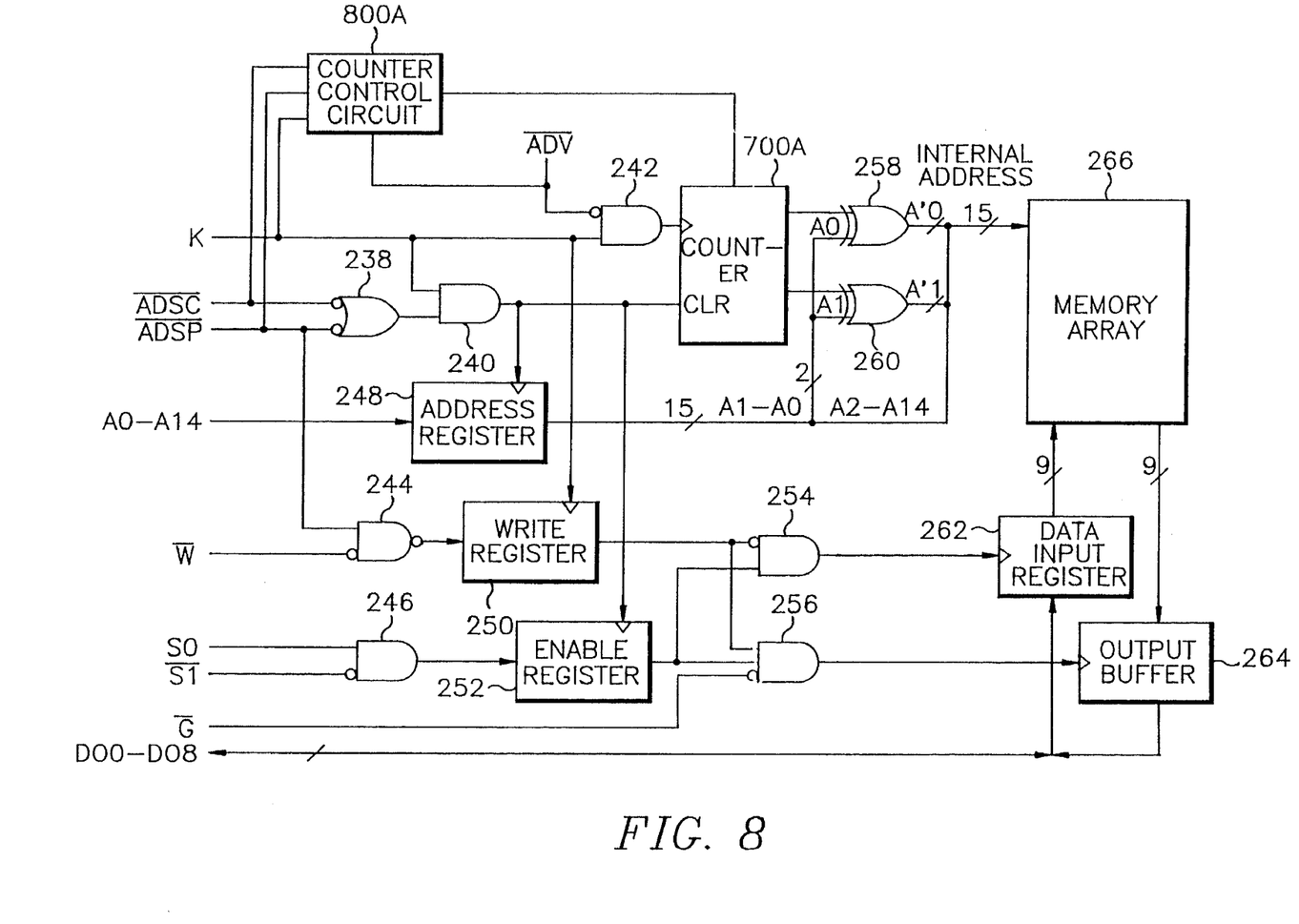
FIG. 8 is a circuit diagram showing a counter and related circuits according to another embodiment of the present invention.

FIG. 8 is a circuit diagram showing the counter and related circuits according to another embodiment of the present invention. In FIG. 8, counter control circuit 800A is a counter control circuit according to the present invention and rest of the circuit is shown on page 7–92 of the aforementioned 1991 "data book" published by Motorola Co., which is incorporated by reference herein. According to the conventional circuit, after control signals ADV, ADS, and ADSP are all enabled, the burst mode is performed by operation of the counter in accordance with the combination of the signals. However, in the present invention, the counter control circuit 800A synchronizes with the system clock K in the burst mode operation and then instantly resets the counter 700A, so that the data access operation can be performed at high speed by the operation of the counter 700A.

The circuit construction of the present invention as described above show a preferred embodiment within the scope and spirit of the present invention. However, it is apparent to one skilled in the art that the circuit may be constructed in various manners within the scope of the present invention. Further, the construction of the counter and the carry generator shown in FIGS. 5 and 6, as well as the construction of the counter control circuit may vary. Further, the counter according to the present invention may be applied to applications having more than one burst address.

As mentioned above, the present invention is provided with the counter and the peripheral circuits reset in advance by the counter control circuit, and enabling the output signal of the counter at high speed in a burst mode of operation, thereby allowing a synchronous random access memory device to operate at a high speed.

What is claimed:

1. A memory device having an external address mode of operation and a burst mode of operation, comprising:

a counter control circuit which generates a counter reset signal during an external address mode of operation; and a counter circuit for generating a counter output during a burst mode of operation, wherein said counter circuit is reset by said counter reset signal.

2. A memory device according to claim 1, wherein said counter control circuit generates said counter reset signal when said memory device is placed in said external address mode of operation.

3. A memory device according to claim 1, wherein said counter output comprises internal address signals.

4. A memory device according to claim 1, further comprising:

an internal address generation circuit responsive to said counter output, wherein during said burst mode of operation said internal address generation circuit generates an internal address based on an external address and said counter output.

5. A memory device according to claim 1, further comprising:

an address buffer for receiving an external address during said external address mode of operation.

6. A memory device comprising:

an external mode of operation for receiving external address signals and a burst mode of operation for generating internal address signals;

a counter control circuit which generates a counter reset signal during said external address mode of operation; and a counter circuit for generating a counter output during said burst mode of operation, wherein said counter circuit is reset by said counter reset signal.

7. A method of controlling a burst mode counter in a memory device comprising the steps of:

placing said memory device in an external address mode of operation;

resetting a burst mode counter during said external address mode of operation; and enabling said burst mode counter during a burst mode of operation, wherein said burst mode counter generates internal address signals.

8. A method of operating a memory device comprising the steps of:

placing said memory device in an external address mode of operation;

resetting a burst mode counter during said external address mode of operation; and generating an internal address during a burst mode of operation, wherein said internal address is based on an external address and an output of said burst mode counter.

9. The method according to claim 7, wherein said burst mode counter is reset when said memory device is placed in said external mode of operation.

10. The method according to claim 8, wherein said burst mode counter is reset when said memory device is placed in said external mode of operation.

* * * * *